United States Patent
Yang

(10) Patent No.: US 9,429,979 B2
(45) Date of Patent: Aug. 30, 2016

(54) CIRCUIT AND METHOD FOR PRODUCING USB HOST WORKING CLOCK

(71) Applicant: IPGoal Microelectronics (Sichuan) Co., Ltd., Chengdu, Sichuan (CN)

(72) Inventor: Xiu Yang, Sichuan (CN)

(73) Assignee: IPGoal Microelectronics (Sichuan) Co., Ltd., Chengdu, Sichuan (CN)

( * ) Notice: Subject to any disclaimer, the term of this patent is extended or adjusted under 35 U.S.C. 154(b) by 243 days.

(21) Appl. No.: 14/141,186

(22) Filed: Dec. 26, 2013

(65) Prior Publication Data

US 2015/0082073 A1    Mar. 19, 2015

(30) Foreign Application Priority Data

Sep. 16, 2013 (CN) .......................... 2013 1 0422149

(51) Int. Cl.
| | |
|---|---|
| G06F 1/04 | (2006.01) |
| G06F 1/08 | (2006.01) |
| G06F 1/12 | (2006.01) |
| G06F 11/16 | (2006.01) |
| H03L 7/00 | (2006.01) |

(52) U.S. Cl.
CPC . G06F 1/04 (2013.01); G06F 1/08 (2013.01); H03L 7/00 (2013.01); *G06F 2213/0042* (2013.01)

(58) Field of Classification Search
CPC .............. G06F 1/04; G06F 1/08; G06F 1/12; G06F 11/1679; G06F 2213/0042
See application file for complete search history.

(56) References Cited

U.S. PATENT DOCUMENTS

| | | | | | |
|---|---|---|---|---|---|
| 6,762,635 | B2 * | 7/2004 | Bruhnke | .................. | H03L 7/00 327/160 |
| 2007/0216487 | A1 * | 9/2007 | Yang | ........................ | H03L 7/07 331/1 A |
| 2011/0208329 | A1 * | 8/2011 | Castor-Perry | ............. | G06F 1/08 700/94 |
| 2012/0051479 | A1 * | 3/2012 | Liu | ........................... | G06F 1/12 375/371 |
| 2013/0076415 | A1 * | 3/2013 | Hara | ..................... | H03L 7/1974 327/159 |
| 2013/0103969 | A1 * | 4/2013 | Wang | ........................ | G06F 1/12 713/502 |

OTHER PUBLICATIONS

Motorola, Nov. 2000, Motorola Literature Distribution, DSP56300 Family Manua Revision 3.0 pages, Chapter 6, pp. 1-5I.*

* cited by examiner

*Primary Examiner* — Kim Huynh
*Assistant Examiner* — Siamak S Hefazi

(57) ABSTRACT

A circuit for producing USB host working clock comprises: an internal oscillator, a controllable frequency divider, a frequency multiplier, a USB host interface, and a frequency division controller. According to the frequency multiplier providing clock, the USB host interface configures with USB peripherals for responding. The frequency division controller is connected to the USB host interface and the controllable frequency divider. The USB host interface transmits a response result that the USB host interface configures with USB peripherals for responding to the frequency division controller. According to the USB host interface feeding back the response result, the frequency division controller regulates a frequency dividing ratio of the controllable frequency divider in set scope of the frequency dividing ratio. After regulating the frequency dividing ratio of the controllable frequency divider, the frequency division controller controls the controllable frequency divider that is processed with frequency division in fixed frequency dividing ratio.

3 Claims, 2 Drawing Sheets

US 9,429,979 B2

CIRCUIT AND METHOD FOR PRODUCING USB HOST WORKING CLOCK

CROSS REFERENCE OF RELATED APPLICATION

The present invention claims priority under 35 U.S.C. 119(a-d) to CN 201310422149.4, filed Sep. 16, 2013.

BACKGROUND OF THE PRESENT INVENTION

1. Field of Invention

The present invention relates to a field of USB communication, and more particularly to a circuit and method for producing USB host working clock.

2. Description of Related Arts

USB is the abbreviation of Universal Serial BUS. Because the communication speed of USB is fast, the interface of USB is simple, the application of USB is convenient, and other advantages of USB; USB has already become one of essential standard interfaces for PC, MP4, mobile phones, PDA (Personal Digital Assistant), digital cameras, printers, scanners, and other electronic equipments, and thus is applied widely in some aspects of information communication and data transmission.

Each of the conventional communication system needs a relatively accurate clock source. Using the clock source, a master clock that is needed by the communication system working is produced through the logic of the frequency division or the frequency multiplication inside the communication system, and the transmitted data flow is analyzed and collected, for achieving the purpose of data communication. The USB communication system is also without exception. In the high speed communication of USB (i.e., the communication speed reaches to 480 MHz), the USB communication system requires the higher accuracy of the data transfer clock (±0.5‰). Therefore, the USB communication system usually utilizes the clock of the external oscillator on the USB main structure. That is to say, the external part produces an accuracy clock (for example, 12 MHz) through the crystal oscillator, which is input to the internal part of the chip of the USB main structure and then is processed with frequency multiplication through the logical module of PLL, for producing the high speed working clock of 480 MHz that is finally needed by the system.

Because of the crystal oscillator, the chip of the USB main structure needs to configure at least two pins to the crystal oscillator. In that way, in the electronic products which have relatively less pins, the USB communication system can not be used to communicate. For example, in the conventional electronic products such as SIM card, pins are usually 4-7. Because of the demand of other system functions, no two extra pins can be configured to the crystal oscillator, so the USB main structure can not be used to communicate.

Moreover, along with the development of the manufacturing technique and the improvement of the design technology, the volume of electronic products is becoming smaller and smaller, and pins of electronic products are becoming fewer and fewer. However, the volume of the crystal oscillator is relatively big to the SOC (System on Chip), and thus the development of the high integration and the miniaturization of electronic products is restricted. Therefore, the crystal oscillator is the key factor to restrict the application and the development of the chip of the USB main structure.

Certainly, the internal part of the chip of the USB main structure is also able to generate the clock through the RC oscillator or the LC oscillator, and is provided to the system to use. Because of the technological error of the RC oscillator or the LC oscillator and the effect of other factors, the clock is generated by the oscillator in the internal part of the chip usually exits the error of ±20% with respect to the design objective, which is not able to satisfy the transmission accuracy requirement of the system.

Therefore, it is necessary to provide an advanced clock producing circuit and the method thereof, for the USB communication system to normally communicate, so as to cover flaws which have been mentioned above.

SUMMARY OF THE PRESENT INVENTION

An object of the present invention is to provide a circuit and method for producing USB host working clock. A technical scheme of the present invention is to produce and to configure a working clock that is suitable for a USB host interface, in such a manner that the USB host interface communicates with USB peripherals in a high precision, and an external oscillator is not needed.

In order to accomplish the above objects, the present invention provides a circuit for producing USB host working clock, comprising:
an internal oscillator,
a controllable frequency divider,
a frequency multiplier,
a USB host interface,
and a frequency division controller.

The internal oscillator produces a clock with a fixed frequency. The controllable frequency divider is connected to the internal oscillator, and the clock that is produced by the internal oscillator is processed with a frequency division by the controllable frequency divider in a set frequency dividing ratio. The frequency multiplier is connected to the controllable frequency divider. A frequency of the clock that is divided by the controllable frequency divider is processed with a frequency multiplication by the frequency divider in a fixed frequency multiplication ratio. The USB host interface is connected to the frequency multiplier. The frequency multiplier transmits a frequency of the clock that is multiplied to the USB host interface. According to the clock provided by the frequency multiplier, the USB host interface configures with USB peripherals for responding. The frequency division controller is connected to the USB host interface and the controllable frequency divider. The USB host interface transmits a response result that the USB host interface configures with USB peripherals for responding to the frequency division controller. According to the response result that is fed back by the USB host interface, the frequency division controller regulates a frequency dividing ratio of the controllable frequency divider in a set scope of the frequency dividing ratio. After regulating the frequency dividing ratio of the controllable frequency divider, the frequency division controller controls the controllable frequency divider to process the frequency division in a fixed frequency dividing ratio.

Preferably, the internal oscillator is an RC oscillator or an LC oscillator.

Preferably, according to the response result that is fed back by the USB host interface, the frequency division controller controls and regulates the frequency dividing ratio of the controllable frequency divider in the set scope of the frequency dividing ratio in a descending order.

Preferably, the frequency division controller records the response result that is fed back by the USB host interface under every clock. After the USB host interface completes configuring with USB peripherals for responding for one cycle under all the clocks that are output by the frequency multiplier, according to all the response results in one cycle, the frequency division controller records an effective length of the clock that the USB host interface configures with USB peripherals for responding, and according to the frequency dividing ratio corresponding to a mid point value of the effective length, the frequency division controller ensures a fixed frequency dividing ratio of the controllable frequency divider.

Accordingly, the present invention provides a method for producing USB host interface working clock, and the method comprises steps of:

according to error characteristics of an internal oscillator, presetting a scope of a frequency dividing ratio to a frequency division controller;

producing a clock with a fixed frequency by the internal oscillator;

processing the clock that is produced by the internal oscillator with a frequency division by a controllable frequency divider;

processing a frequency of the clock that is divided with a frequency multiplication by a frequency multiplier in the fixed frequency, and transmitting the frequency of the clock that is multiplied to a USB host interface by the frequency multiplier;

according to the clock that is received, configuring the USB host interface with USB peripherals for responding, and transmitting a response result that the USB host interface configures with USB peripherals for responding to the frequency division controller by the USB host interface;

recording the response result that the USB host interface configures with USB peripherals for responding by the frequency division controller, according to the response result, regulating a frequency dividing ratio of the controllable frequency divider in a set scope of the frequency dividing ratio, after regulating the frequency dividing ratio of the controllable frequency divider, controlling the controllable frequency divider that is processed with the frequency division in the fixed frequency dividing ratio by the frequency division controller.

Preferably, repeating following steps of:

according to the response result, controlling and regulating the frequency dividing ratio of the controllable frequency divider by the frequency division controller;

according to the response result that is output by the USB host interface, controlling the frequency dividing ratio of the controllable frequency divider by the frequency division controller in the set scope of the frequency dividing ratio in the descending order.

Preferably, after the USB host interface completes configuring with USB peripherals for responding for one cycle under all clocks that are output by the frequency multiplier, according to all the response results in one cycle, the frequency division controller records the effective length of the clock that the USB host interface configures with USB peripherals for responding, and according to the frequency dividing ratio corresponding to the mid point value of the effective length, the frequency division controller ensures the fixed frequency dividing ratio of the controllable frequency divider.

Compared with the conventional technology, in the circuit and method for producing USB host working clock of the present invention, according to the response result that is fed back by the USB host interface, the frequency division controller regulates the frequency dividing ratio of the controllable frequency divider in the set scope of the frequency dividing ratio, and after regulating the frequency dividing ratio of the controllable frequency divider, the frequency division controller controls the controllable frequency divider that is processed with the frequency division in the fixed frequency dividing ratio. Thus, after all frequency dividing ratios in the scope of the frequency dividing ratio that are all used, according to the response result that is fed back by the USB host interface, the frequency division controller chooses a most appropriate frequency dividing ratio to be the fixed frequency dividing ratio of the controllable frequency divider in the scope of the frequency dividing ratio, so a frequency of the clock which is output by the controllable frequency divider after the frequency division meets a set requirement. That is to say, through the clock is processed with the frequency multiplication by the frequency multiplier, the USB host interface communicates normally with USB peripherals, and an accuracy of a communication is guaranteed.

Through the following descriptions and combined with drawings, the present invention will be more legible. Drawings are used to explain the present invention.

These and other objectives, features, and advantages of the present invention will become apparent from the following detailed description, the accompanying drawings, and the appended claims.

DETAILED DESCRIPTION OF THE PREFERRED EMBODIMENT

Referring to attached drawings, a preferred embodiment of the present invention is illustrated, wherein each element is represented by a corresponding designator. As mentioned above, the present invention provides a circuit and method for producing USB host working clock. A technical scheme of the present invention is to produce and to configure a working clock that is suitable for a USB host interface, in such a manner that the USB host interface communicates with USB peripherals in a high precision, and an external oscillator is not needed.

Figure 1:
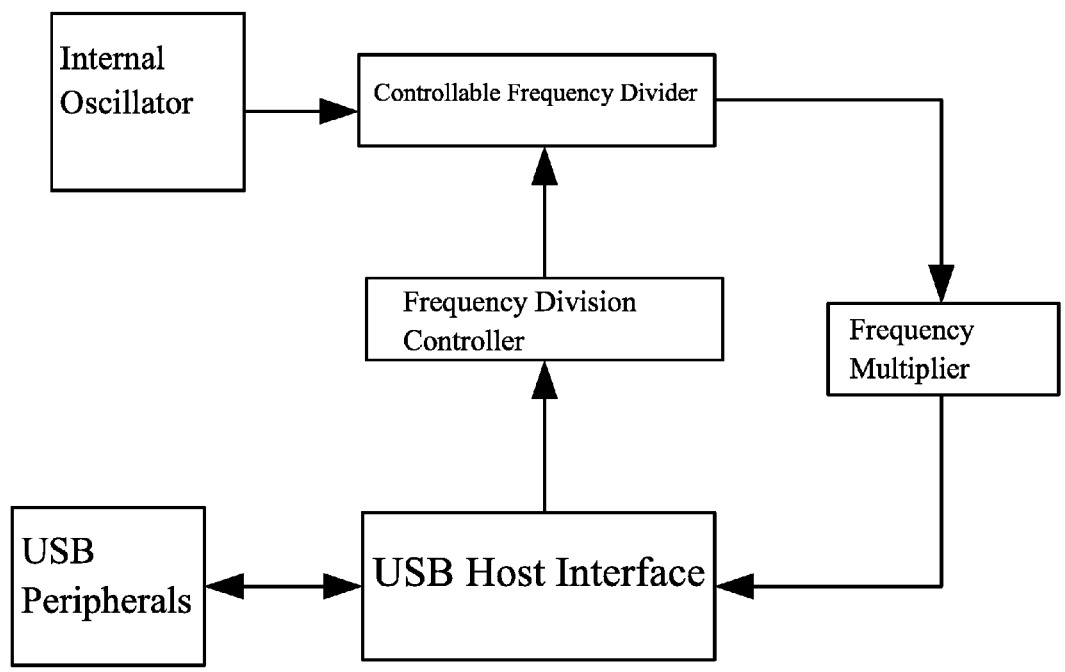
FIG. 1 is a structural schematic view that a circuit for producing USB host working clock is connected to USB peripherals, according the present invention.

Referring to FIG. 1 of the drawings, FIG. 1 is a structural schematic view that a circuit for producing USB host working clock is connected to USB peripherals. The present invention provides a circuit for producing USB host working clock, comprising:

an internal oscillator,
a controllable frequency divider,
a frequency multiplier,
a frequency division controller, and
a USB host interface.

The internal oscillator is connected to the controllable frequency divider, in order to produce a clock with a fixed frequency, and the internal oscillator transmits the clock produced to the controllable frequency divider. The controllable frequency divider is connected to the frequency multiplier and the frequency division controller. The clock that is produced by the internal oscillator is processed with a frequency division by the controllable frequency divider under a control of the frequency division controller, and the controllable frequency divider transmits a frequency of the clock divided to the frequency multiplier. The frequency multiplier is connected to the USB host interface. The frequency of the clock that is divided by the controllable frequency divider is processed with a frequency multiplication by the frequency multiplier in a fixed frequency, and the frequency multiplier transmits the frequency of the clock multiplied to the USB host interface. According to the clock that is received, the USB host interface configures with USB peripherals for responding, wherein whether the USB host interface configures with USB peripherals for responding successfully, is determined by the frequency of the clock that is output by the frequency multiplier. If the frequency of the clock that is output by the frequency multiplier is in a scope of USB peripherals that is successfully responded, the USB host interface will be able to configure with USB peripherals for responding successfully; otherwise, the USB host interface will configures with USB peripherals for responding unsuccessfully, and according to different configuration results, the USB host interface produces different response results correspondingly. The frequency division controller is connected to the controllable frequency divider and the USB host interface. According to a result that the USB host interface configures with USB peripherals i.e., whether the USB host interface configures with USB peripherals for responding successfully, the USB host interface regulates a frequency dividing ratio of the controllable frequency divider in a set scope of the frequency dividing ratio, wherein according to error characteristics of the internal oscillator, a scope of the frequency dividing ratio is preset in the frequency division controller, and after regulating the frequency dividing ratio of the controllable frequency divider, the frequency division controller controls the controllable frequency divider that is processed with the frequency division in a fixed frequency dividing ratio.

Specifically, in the preferred embodiment of the present invention, the internal oscillator is an RC oscillator or an LC oscillator. Because a structure of the RC oscillator or the LC oscillator is simple, a volume of the RC oscillator or the LC oscillator is small, and a required frequency clock can be produced, so using the RC oscillator or the LC oscillator do not affect a development of a high integration and miniaturization of a production of USB system. The RC oscillator or the LC oscillator outputs a clock that is a high frequency clock, usually 300 MHz. However, the RC oscillator or the LC oscillator produces the clock with a certain error. Generally, an error reaches to ±20% in a maximum, that is to say, a scope of the clock that is output is between 240 MHz and 360 MHz. Corresponding, the error of the clock that is output by the RC oscillator or the LC oscillator makes the scope of the frequency dividing ratio that is preset in the frequency division controller, which is also between 240 MHz and 360 MHz; wherein a phase of the clock that is produced by the RC oscillator or the LC oscillator can be designed according to a precision requirement of a design, generally, four phases, eight phases, sixteen phases, and etc. are provided. The controllable frequency divider is connected to the RC oscillator or the LC oscillator, the frequency division controller, and the frequency multiplier. The clock that is output by the RC oscillator or the LC oscillator is processed with the frequency division by the controllable frequency divider according to a set requirement, and the controllable frequency divider transmits the frequency of the clock that is divided to the frequency multiplier; wherein the frequency dividing ratio of the controllable frequency divider can be controlled and regulated through the frequency division controller. The frequency multiplier is connected to the USB host interface. The frequency of the clock that is divided and is produced by the controllable frequency divider is processed with the frequency multiplication by the frequency multiplier in a fixed ratio, for producing a 480 MHz high frequency clock, to provide a working clock to the USB host interface, to make that the USB host interface is able to communicate in a high speed normally. Obviously, because the high frequency clock that is produced by the RC oscillator or the LC oscillator exists an error, so after the clock is processed with frequency division by the controllable frequency and is output by the frequency multiplier, which is not an accurate 480 MHz clock, and the frequency dividing ratio of the controllable frequency divider is needed to regulate and calibrate specifically through the frequency division controller, to guarantee that the frequency multiplier is able to output an accurate 480 MHz clock. In the preferred embodiment of the present invention, a feedback loop is constituted by the controllable frequency divider, the frequency multiplier, the USB host interface, and the frequency division controller. Thus, in a process of using, according to a response result, the frequency division controller controls and regulates the frequency dividing ratio of the controllable frequency divider in the scope of the frequency dividing ratio, and according to the response result that is output by the USB host interface, the frequency division controller controls the frequency dividing ratio of the controllable frequency divider in a descending order. Until the USB host interface completes configuring with USB peripherals for responding for one cycle under all clocks that are output by the frequency multiplier, that is to say, every frequency dividing ratio in the scope of the frequency dividing ratio are all used for one time, according to all the response results in one cycle, the frequency division controller records an effective length of a clock that the USB host interface configures with USB peripherals for responding, and according to the frequency dividing ratio corresponding to a mid point value of the effective length, the frequency division controller ensures the fixed frequency dividing ratio of the controllable frequency divider. In the present invention, after the USB host interface completes configuring with USB peripherals for responding for one cycle under all clocks, the frequency division controller ensures the effective length of the clock that the USB host interface is able to configure with USB peripherals for responding successfully, that is to say, the frequency division controller ensures the fixed frequency dividing ratio of the controllable frequency divider. Because of an unexpected mutation of a whole circuit in a certain instant, a frequency of one of clocks that is output by the frequency multiplier fells into the effective length of the clock, the frequency of the clock is recorded by the frequency division controller, and the effective length of the clock is divided in an error, which is avoided effectively. After through one completed cycle for configuring and responding and the effective length of the clock is ensured, the frequency of the clock that is out of the effective length, abnormal, and loosely fell into the effective length of the clock is removed effectively and an accuracy of the circuit for producing USB host working clock of the present invention is improved. Through repeating regulations and selections for several times that are mentioned above, the frequency multiplier outputs an accurate and stable 480 MHz clock, so under a control of the clock, a high speed communication of various packets between the USB host interface and a USB external modem is a high precision.

Referring to FIG. 1, a specific implementation process of the circuit for producing USB host working clock of the present invention is described as followed.

The circuit for producing the clock uses a 300 MHz LC oscillator. A clock with eight phases that is produced by the LC oscillator is provided to the controllable frequency divider to process with a decimal frequency division; wherein an error of a frequency of the clock may be relatively large, the error may be ±20% maximum. Thus, the scope of the frequency dividing ratio of the controllable frequency divider is also 300±20%, i.e., 240-360, and a specific frequency dividing ratio is a step of 1/8. The controllable frequency divider processes the clock that is output by the LC oscillator with the frequency division, produces a clock that is around 1 MHz, outputs to the frequency multiplier, processes with the frequency multiplication to around 480 MHz, and provides to the USB host interface to use. According to the response result that is fed back by the USB host interface, the frequency division controller controls and regulates the frequency dividing ratio of the controllable frequency divider in the scope of the frequency dividing ratio that is 240-360 in the descending order. That is to say, at a beginning, the frequency division controller configures the frequency dividing ratio of 360 to the controllable frequency divider; the frequency multiplier produces a corresponding clock and provides to the USB host interface; according to the clock, the USB host interface configures with USB peripherals for responding, and feeds back the response result to the frequency division controller, that is to say, a configuration response under a clock is completed; and then, according to the previous response result, the frequency division controller configures the frequency dividing ratio that is $$359\tfrac{7}{8}$$

to the controllable frequency divider, the frequency multiplier produces the corresponding clock and provides to the USB host interface, according to the clock, the USB host interface configures with USB peripherals for responding, and feeds back the response result to the frequency division controller; that is to say, under the clock, another configuration response is completed. Repeating in this way, the frequency dividing ratio that is configured by the frequency division controller is $$359\tfrac{6}{8}, 359\tfrac{5}{8}, \text{ and } 359\tfrac{4}{8}$$

in order, a step of $$\tfrac{1}{8}$$

is decreased until the frequency dividing ratio is 240. Thus, in the basis of the step of $$\tfrac{1}{8},$$

in the scope of the frequency dividing ratio that is 240-360, under the corresponding clock, a configuration response between the USB host interface and USB peripherals is scanned fully, according to all response results in one cycle, the frequency division controller records the effective length of the clock that the USB host interface configures with USB peripherals for responding, and according to the frequency dividing ratio corresponding to the mid point value of the effective length, the frequency division controller ensures and controls the frequency dividing ratio of the controllable frequency divider; herein, for example, the mid point value of the effective length of the clock is 480 MHz, and the frequency dividing ratio of the controllable frequency divider corresponds to the mid point value is 300, that is to say, 300 is ensured as the fixed frequency dividing ratio of the controllable frequency divider, and in a process of follow-up works of the circuit for producing USB host working clock of the present invention, all through the frequency division controller to control the frequency dividing ratio of the controllable frequency divider to be 300, for guaranteeing that the USB host is able to communicate normally with USB peripherals.

Figure 2:
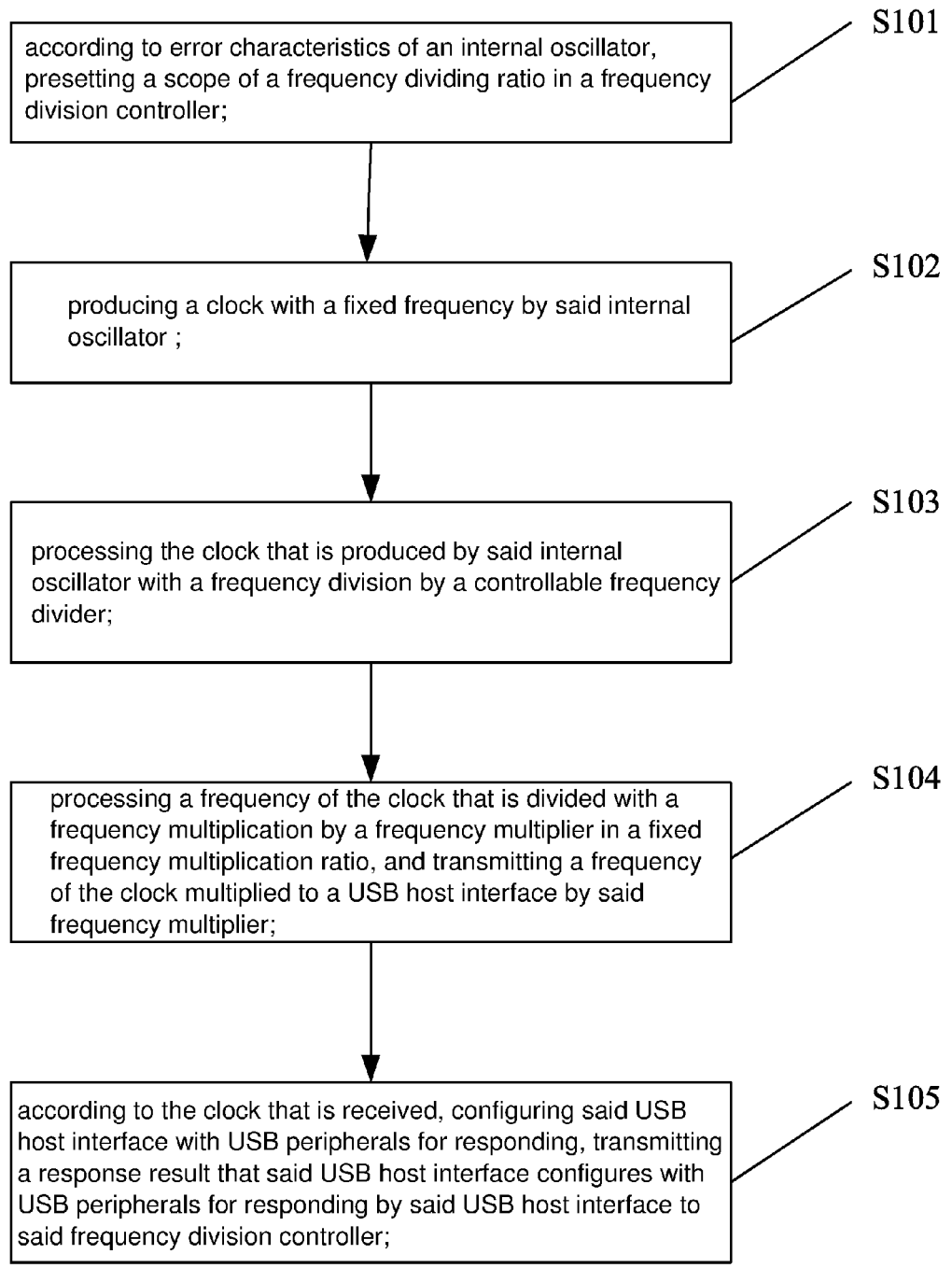
FIG. 2 is a flow chart of a method for producing USB host working clock, according to the present invention.

Referring to FIG. 2, a method for producing USB host working clock of the present invention is described. As shown in FIG. 2, the method for producing USB host working clock comprises steps of:

Step S101, according to error characteristics of an internal oscillator, presetting a scope of a frequency dividing ratio in a frequency division controller;

in a present step, because producing a frequency of a clock by the internal oscillator that is usually 300 MHz, and an error reaches to ±20% in maximum, so presetting the scope of the frequency dividing ratio in the frequency division controller that is 240-360, for corresponding with the error of the internal oscillator.

Step S102, producing the clock with a fixed frequency by the internal oscillator;

in the present step, producing the clock by the internal oscillator is a high frequency clock, generally 300 MHz, through disposing the high frequency clock by follow-up steps, matching a working time of a USB host interface with a clock of USB peripherals, so through providing a working clock to the USB host interface by the internal oscillator, and providing the clock by a crystal oscillator is not needed, which is benefit to a development of a high integration and miniaturization of a production of USB system;

in addition, in the present step, the internal oscillator is an RC oscillator or an LC oscillator, because a structure of the RC oscillator or the LC oscillator is simple and a volume of the RC oscillator or the LC oscillator is small, so the RC oscillator or the LC oscillator is suitable for the development of the high integration and miniaturization of the production of USB system;

wherein producing the clock with a certain error by the RC oscillator or the LC oscillator, usually, the error reaches to ±20% in maximum, which is needed to regulate and calibrate by follow-up steps.

Step S103, processing the clock that is produced by the internal oscillator with the frequency division by a controllable frequency divider;

in the present step, processing the high frequency clock that is produced by the RC oscillator or the LC oscillator with a decimal frequency multiplication by the controllable frequency divider, in order to further dispose the clock by follow-up steps.

Step S104, processing the frequency of the clock that is divided with a frequency multiplication by a frequency multiplier in a fixed frequency multiplication ratio, and transmitting the frequency of the clock that is multiplied to the USB host interface by the frequency multiplier;

in the present step, processing the frequency of the clock divided that is produced by the controllable frequency divider with the frequency multiplication by the frequency multiplier in the fixed frequency multiplication ratio, in order to produce an around 480 MHz high frequency clock, transmitting the frequency of the clock that is multiplied to the USB host interface by the frequency multiplier, in order to provide the working clock for the USB host interface;

obviously, because producing the high frequency clock by the RC oscillator or the LC oscillator exists the error, so outputting the clock by the frequency multiplier is not an accurate 480 MHz clock, and needs to specifically regulate.

Step S105, according to the clock that is received, configuring the USB host interface with USB peripherals for responding, transmitting a response result that the USB host interface configures with USB peripherals for responding to the frequency division controller by the USB host interface;

in the present step, whether the USB host interface configures with USB peripherals for responding successfully, is decided by the frequency of the clock that is output by the frequency multiplier, if the frequency of the clock that is output by the frequency multiplier in the scope of USB peripherals that is successfully responded, the USB host interface will configures with USB peripherals for responding successfully;

otherwise, the USB host interface will configures with USB peripherals for responding unsuccessfully;

according to different configuration results, producing different response results by the USB host interface correspondingly.

Step S106, recording the response result that the USB host interface configures with USB peripherals for responding by the frequency division controller, and according to the response result, regulating the frequency dividing ratio of the controllable frequency divider in a set scope of the frequency dividing ratio, and after regulating the frequency dividing ratio of the controllable frequency divider, controlling the controllable frequency divider that is processed with the frequency division in the fixed frequency dividing ratio by the frequency division controller;

in the present step, according to the response result, controlling and regulating the frequency dividing ratio of the controllable frequency divider by the frequency division controller, and according to the response result that is output by the USB host interface, controlling and regulating the frequency dividing ratio of the controllable frequency divider by the frequency division controller for several times in the set scope of the frequency dividing ratio in the descending order, that is to say, regulating the frequency dividing ratio of the controllable frequency divider that is repeated for several times, wherein under outputting all clocks by the frequency multiplier, until the USB host interface completes configuring with USB peripherals for responding for one cycle, that is to say, every frequency dividing ratio in the scope of the frequency dividing ratio are all used for one time, according to all the response results in one cycle, recording an effective length of the clock that the USB host interface configures with USB peripherals for responding by the frequency division controller, and according to the frequency dividing ratio corresponding to the mid point value of the effective length, ensuring the fixed frequency dividing ratio of the controllable frequency divider by the frequency division controller;

so completing to regulate the frequency dividing ratio of the controllable frequency divider, in the process of follow-up works, processing the controllable frequency divider with the frequency division in the fixed frequency dividing ratio, that is to say, the frequency of the clock is output by the frequency multiplier is more stable, for guaranteeing the USB host is able to communicate normally with USB peripherals.

In the method for producing USB host working clock of the present invention, after the USB host interface completes configuring with USB peripherals for responding for one cycle under all clocks, the frequency division controller ensures the effective length of the clock that the USB host interface configures with USB peripherals for responding that is successfully, that is to say, the frequency division controller ensures the fixed frequency dividing ratio of the controllable frequency divider, because of an unexpected mutation of a whole circuit in a certain instant, a frequency of one of clocks that is output by the frequency multiplier fells into the effective length of the clock, the frequency division controller records the frequency of the clock, and the effective length of the clock is divided in an error, which can be avoided effectively, through one completed cycle for configuring and responding and to ensure the effective length of the clock, the frequency of the clock that is out of the effective length, abnormal, and loosely fell into the effective length of the clock can be removed effectively, and to improve an accuracy of the circuit for producing USB host working clock of the present invention.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A circuit for producing USB host working clock, comprising:
    an internal oscillator, a clock with a fixed frequency is produced by said internal oscillator;
    a controllable frequency divider, said controllable frequency divider is connected to said internal oscillator, and the clock that is produced by said internal oscillator is processed with a frequency division by said controllable frequency divider in a set frequency dividing ratio;
    a frequency multiplier, said frequency multiplier is connected to said controllable frequency divider, the clock is processed with the frequency division by said controllable frequency divider, which is processed with a frequency multiplication by said frequency multiplier in a fixed frequency multiplication ratio;
    a USB host interface, said USB host interface is connected to said frequency multiplier, said frequency multiplier transmits a frequency of the clock that is multiplied to said USB host interface, according to the clock that is provided by said frequency multiplier, said USB host interface configures with USB peripherals for responding;
    a frequency division controller, said frequency division controller is connected to said USB host interface and said controllable frequency divider, said USB host interface transmits a response result that said USB host interface configures with USB peripherals for responding to said frequency division controller, according to the response result that is fed back by said USB host interface, said frequency division controller controls and regulates the frequency dividing ratio of said controllable frequency divider in the set scope of the frequency dividing ratio, wherein the frequency dividing ratio is decreased by ⅛ MHz per time until the frequency dividing ratio reaches a minimum value in the set scope;

wherein said frequency division controller records the response result that is fed back by said USB host interface under every clock, after said USB host interface completes configuring with USB peripherals for responding for one cycle under all clock that is output by said frequency multiplier, according to all the response results in one cycle, said frequency division controller records an effective duration of a clock that said USB host interface configures with USB peripherals for responding, according to the frequency dividing ratio corresponding to a mid point value of the effective duration, said frequency division controller endures a fixed frequency dividing ratio of said controllable frequency divider.

2. The circuit for producing USB host working clock, as recited in claim 1, wherein said internal oscillator is an RC oscillator or an LC oscillator.

3. A method for producing USB host working clock, comprising steps of:

according to error characteristics of an internal oscillator, presetting a scope of a frequency dividing ratio in a frequency division controller;

producing a clock with a fixed frequency by said internal oscillator;

processing the clock that is produced by said internal oscillator with a frequency division by a controllable frequency divider;

processing a frequency of the clock that is divided with a frequency multiplication by a frequency multiplier in a fixed frequency multiplication ratio, and transmitting a frequency of the clock multiplied to a USB host interface by said frequency multiplier;

according to the clock that is received, configuring said USB host interface with USB peripherals for responding, transmitting a response result that said USB host interface configures with USB peripherals for responding by said USB host interface to said frequency division controller;

recording the response result that said USB host interface configures with USB peripherals for responding by said frequency division controller, according to the response result, controlling and regulating the frequency dividing ratio of said controllable frequency divider by said frequency division controller, according to the response result that is output by said USB host interface, controlling the frequency dividing ratio of said controllable frequency divider by said frequency division controller in the set scope of the frequency dividing ratio, wherein the frequency dividing ratio is decreased by ⅛ MHz per time until the frequency dividing ratio reaches a minimum value in the set scope; and after said USB host interface completes configuring with USB peripherals for responding for one cycle, according to all the response results in one cycle, recording an effective duration of a clock that said USB host interface configures with USB peripherals for responding by said frequency division controller, according to the frequency dividing ratio corresponding to a mid point value of the effective duration, ensuring the fixed frequency dividing ratio of said controllable frequency divider by said frequency division controller.

* * * * *